United States Patent [19]
Kawakami

[11] Patent Number: 5,404,637
[45] Date of Patent: Apr. 11, 1995

[54] METHOD OF MANUFACTURING MULTILAYER PRINTED WIRING BOARD

[75] Inventor: Shin Kawakami, Iruma, Japan

[73] Assignee: Nippon CMK Corp., Japan

[21] Appl. No.: 54,960

[22] Filed: Apr. 30, 1993

[30] Foreign Application Priority Data

May 1, 1992 [JP] Japan .................................. 4-140016
Jun. 22, 1992 [JP] Japan .................................. 4-187547

[51] Int. Cl.$^6$ .............................................. H01R 9/06
[52] U.S. Cl. ........................................ 29/843; 29/830; 174/263; 439/83
[58] Field of Search .......................... 29/843, 825, 830; 174/263; 439/83

[56] References Cited

U.S. PATENT DOCUMENTS

| | | | |
|---|---|---|---|
| 2,902,629 | 9/1959 | Little et al. ..................... | 174/263 X |
| 3,159,906 | 12/1964 | Telfer ................................ | 29/843 |
| 3,184,830 | 5/1965 | Lane et al. ...................... | 29/843 |
| 3,500,538 | 3/1970 | Raciti ................................ | 29/825 |

FOREIGN PATENT DOCUMENTS

| | | | |
|---|---|---|---|
| 969819 | 7/1958 | Germany ......................... | 439/83 |
| 2326170 | 12/1974 | Germany ......................... | 174/263 |

OTHER PUBLICATIONS

IBM Technical Disclosure Bulletin vol. 9 No. 4 Sep. 1966 p. 366 by H. P. Byrnes.

*Primary Examiner*—Carl J. Arbes
*Attorney, Agent, or Firm*—Adams & Wilks

[57] ABSTRACT

A method of manufacturing a printed wiring board. A printed wiring board having a substrate and a circuit pattern formed thereon is provided. At least one through-hole is formed in the substrate. A plurality of fine wires are inserted into the through-hole, and a molten solder is filled into the through-hole by a capillary action due to small gaps formed between the fine wires. A multilayer printed wiring board may be provided comprising a plurality of wiring board layers each having a substrate and a respective circuit pattern formed thereon. The molten solder filled in the through-hole electrically connects at lest two of the respective circuit patterns. The plurality of fine wires may be disposed in a conductive hollow tubular body which is inserted along with the fine wires into the through-hole. Also, the plurality of fine wires may be arranged as a mesh sheet that is formed into a tubular body and inserted into the through-hole. If an electronic component is to be connected with the printed wiring board through the through-hole, the leads of the electronic component may comprise the plurality of fine wires.

16 Claims, 3 Drawing Sheets

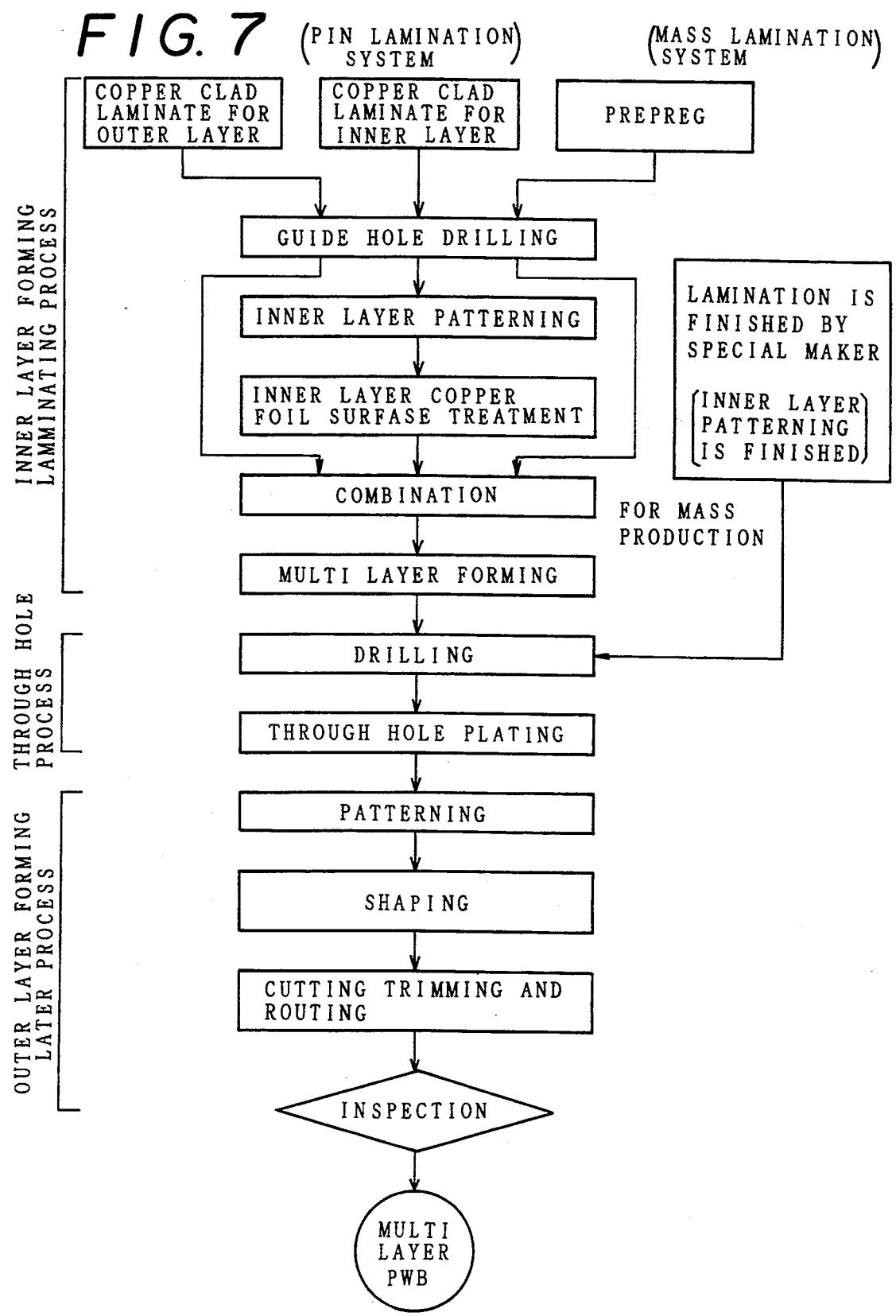

METHOD OF MANUFACTURING MULTILAYER PRINTED WIRING BOARD

BACKGROUND OF THE INVENTION

1. Field of the Invention

The present invention relates to a method of manufacturing multilayer printed wiring board.

2. Description of the Related Art

In a conventional printed wiring board, high densifying of printed wiring circuits and downsizing of the printed wiring board itself are promoted. To this end double sided and to multilayer printed wiring boards have been developed and put into practice.

Manufacture of multilayer printed wiring board comprises an inner layer forming process, a laminating process, a through hole process, an outer layer forming process and a later manufacturing process as shown in FIG. 7.

In the method of manufacturing multilayer printed wiring boards, as a means for connecting respective layers, through hole connections are used, as shown in FIG. 7. Through hole plating is accomplished by copper electroless deposition or plating and copper electroplating.

In the connecting method using through hole plating, however, the plating apparatus is large, the cost of equipment is high and at the same time, the working environment is difficult. Also a severe requirement is imposed on the control of plating solution itself, resulting in a number of problems, such environmental problems resulting from the use of the plating solution.

SUMMARY OF THE INVENTION

It is an object of the present invention to overcome the above described disadvantages of the method of manufacturing multilayer printed wiring board.

It is another object of the present invention to provide a simple, low cost method of manufacturing a highly reliable multilayer printed wiring board.

In accordance with the present invention, there is provided a method of manufacturing multilayer printed wiring board in which respective layers of a multilayer printed wiring board are formed with respective printed wiring boards, respective printed wiring boards are laminated and pasted up, and necessary circuits of the printed wiring board are electrically connected through through-holes punched into respective printed wiring boards. The inventive method comprises the steps of: inserting a plurality of fine wires into respective through holes punched in the respective printed wiring boards; filling the through-holes of the connecting lands with solder by a capillary phenomenon; and electrically connecting necessary circuits between the respective printed wiring boards with each other.

In accordance with the present invention, the plurality of fine wires inserted into respective through-holes punched in the respective printed wiring boards are formed by a tubular body which comprises a conductive short tube and a plurality of fine wires.

In the preferred embodiment, the plurality of fine wires inserted into respective through-holes punched in the respective printed wiring boards are formed by an inserting body which comprises a mesh sheet formed by arranging the fine wires in a meshed form.

The fine wire is wound on the lead wires of an electronic component. The plurality of fine wires inserted into respective through-holes punched in the respective printed wiring boards are formed by a tubular body formed by winding the mesh sheet in the tubular shape. The plurality of fine wires inserted into respective through holes punched in the respective printed wiring boards are formed by a tubular body which comprises a conductive short tube having a length shorter than that of the short tube of the tubular body and a plurality of fine wires.

According to the method of manufacturing multilayer printed wiring board of the present invention, the conduction of the through holes is performed by inserting a plurality of fine wires into respective through-holes punched in the respective printed wiring boards, so that the disadvantages of through-hole plating are eliminated and multilayer printed wiring board can be provided with low price and high reliability.

BRIEF DESCRIPTION OF THE DRAWINGS

FIG. 7 is an explanatory view showing a conventional method of manufacturing multilayer printed wiring board.

DETAILED EXPLANATION OF THE PREFERRED EMBODIMENT

Now to the drawings, there are shown various embodiments of a method of manufacturing multilayer printed wiring board according to the present invention.

Figure 1:
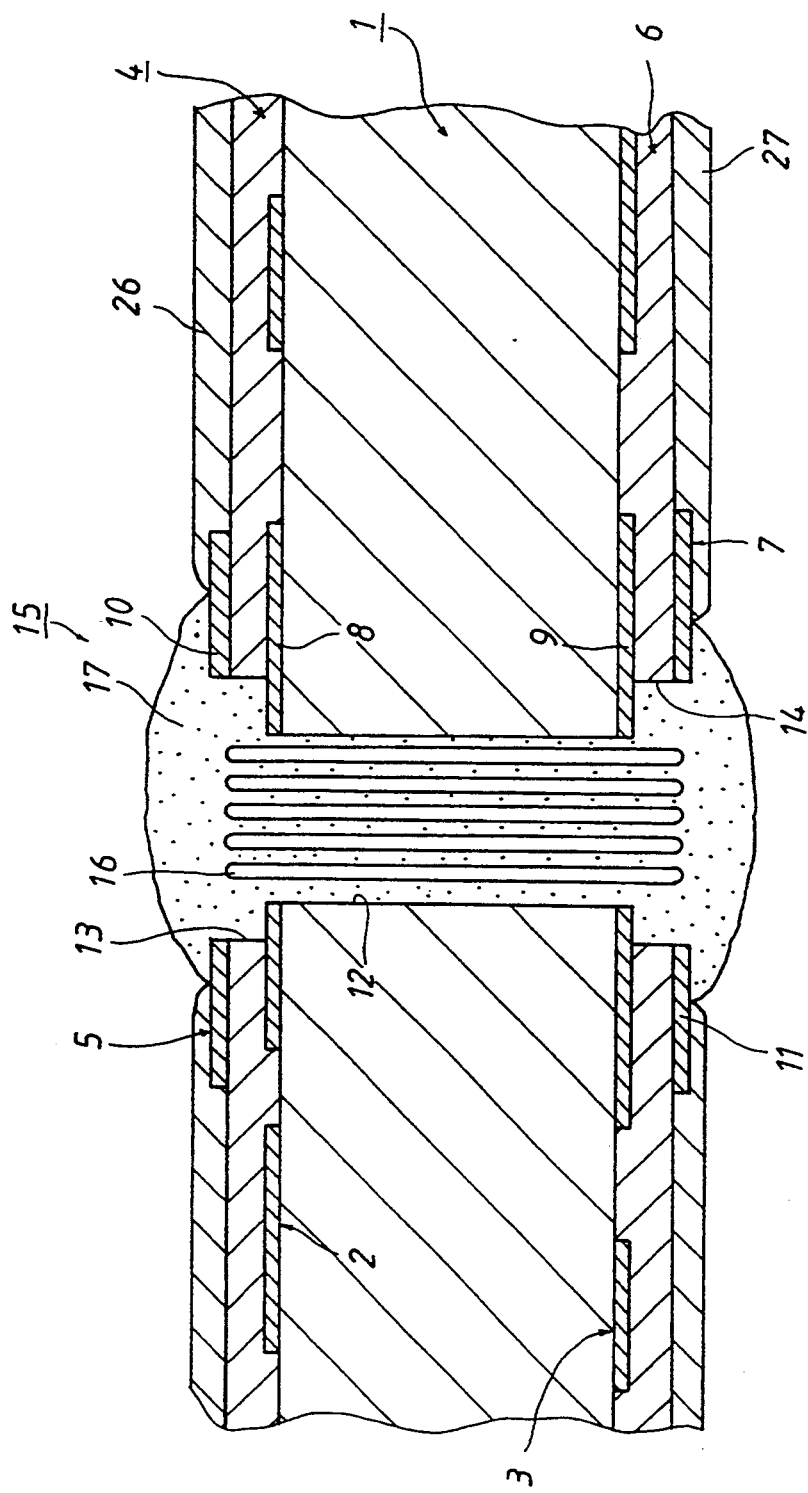
FIG. 1 is a partially expanded sectional view of a multilayer printed wiring board showing a method of manufacturing multilayer printed wiring board according to the present invention.

FIG. 1 is a partially expanded sectional view of a multilayer printed wiring board showing an embodiment of the present invention.

In FIG. 1, reference numeral 1 is a printed wiring board positioned at an inner layer on which a printed wiring circuit 2 as a first layer and a printed wiring circuit 3 as a second layer, are respectively formed on its upper surface and lower surface and hereinafter referred to as an inner layer printed wiring board. Reference numeral 4 is a printed wiring board positioned at the upper outer layer of a printed wiring board 1 and on which a third laminated layer of a printed wiring circuit 5 is formed and hereinafter referred to as a first outer layer printed wiring board. Reference numeral 6 is a printed wiring board positioned at the lower layer of the inner layer printed wiring board 1 on which a fourth laminated layer of a printed wiring circuit is formed.

The connecting lands 8, 9, 10 and 11 for electrically connecting respective printed wiring circuits 2, 3, 5 and 7 with each other are arranged on the inner and outer layer printed wiring boards 1, 4 and 6, at the corresponding positions in the circuit patterns of the respective printed wiring circuits 2, 3, 5 and 7, and respective connecting lands 8, 9, 10 and 11 are provided with through-holes 12, 13 and 14 at the center portions thereof respectively by punching or by means of a drilling process, thereby providing respective inner and outer layer printed wiring boards 1, 4 and 6.

In order to form the respective connecting lands 8, 9, 10 and 11 and respective through holes 12, 13 and 14 of the inner and outer layer printed wiring boards 1, 4 and 6, as shown in FIG. 1, the outer diameter of the connecting lands 8, 9 of the first and second layer printed wiring circuits 2, 3 of the inner printed wiring board 1 are made larger than the diameter of the through hole 13, 14 of connecting lands 10, 11 of the first and second layer printed wiring boards 4, 6. The diameter of the through-holes 13, 14 of connecting lands 10, 11 of the first and second outer layer printed wiring boards 4, 6 are made larger than the diameter of the through-holes 12 of the connecting lands 8, 9 of the inner layer printed wiring board 1 (lager than the diameter of the through-hole 12 by at least 0.2 mm).

According to the above conditions of construction, the inner and outer printed wiring boards 1, 4 and 6 are provided in such a manner that the first and the second printed wiring circuits 2, 3 having the connecting lands 8(10), 9(11) arranged thereon are provided by the conventional well known manufacturing process. For example, the conventional method in which double-sided copper clad laminate having copper foils stretched on both sides of a base material is utilized as the inner printed wiring boards 1. The copper foils on both sides are provided on the inner printed wiring boards 1, 4 and 6 by an etching process and the through-hole 12 is formed by a drilling process. Similarly, the first and the second outer layer printed wiring boards 4, 6 are provided in such a manner that third and fourth layer printed wiring circuits 5, 7 having the connecting lands 10, 11 are formed by utilizing a single-sided copper clad laminate, and the through-holes 13 and 14 are formed by the drilling process.

Then, as shown in FIG. 1, respective inner and outer layer printed wiring boards 1, 4 and 6 are laminated and pasted together.

That is, as shown in FIG. 1, the first outer printed wiring board 4 is laminated on the upper side of the inner printed wiring board 1 and the second outer printed wiring boars 6 is laminated on the lower side of the inner printed wiring board 1, during registering the center of the respective connecting lands 8, 9, 10 and 11 of the respective printed wiring circuits 2, 3, 5 and 7 provided on the respective inner and outer layer printed wiring boards 1, 4 and 6 and the center of the through-holes 12, 13 and 14 of the respective inner and outer layer printed wiring boards 1, 4 and 6. As a bonding process, the pasting of the respective inner and outer layer printed wiring boards 1, 4 and 6 is performed by a mass lamination system using a prepreg.

That is, in such a bonding process, the respective inner and outer layer printed wiring boards 1, 4 and 6 are pasted under laminating conditions by heating and pressing after disposing the prepreg (now shown) between the respective inner and outer layer printed wiring boards 1, 4 and 6 in accordance with registration of the printed wiring boards.

The other pasting process may be adopted as a bonding process.

After laminating and pasting the inner and outer layer printed wiring boards 1, 4 and 6 as described above, as shown in FIG. 1, respective printed wiring circuits are electrically connected through the connecting lands 8, 9, 10 and 11 of the first to fourth layer printed wiring circuits 2, 3, 5 and 7 provided on the respective inner and outer layer printed wiring boards, 1, 4 and 6, thereby manufacturing a four layer printed wiring board 15.

In this case, the electrical connection of the connecting lands 8, 9, 10 and 11 is performed by using a soldering process as opposed to a plating process.

That is, as shown in FIG. 1, the respective connecting lands 8, 9, 10 and 11 are electrically connected in such a manner that a plurality of conductive wires 16 are inserted in the respective through-holes 12, 13 and 14 of the respective connecting lands 8, 9, 10 and 11, and then molten solder 17 is filled in the through-holes 12, 13 and 14 with the utilization of a capillary phenomenon of the fine wires 16 and the solder 17 is solidified.

As an alternation of the process of filling the molten solder 17 in the through-holes 12, 13 and 14 with the utilization of the capillary phenomenon of the fine wires 16, after the pasting process of the respective printed wiring boards, these printed wiring boards 1, 4 and 6 having the fine wires 16 inserted and set in the through holes 12, 13 and 14 may be immersed in a solder vessel (not shown) in which molten solder is filled.

Such a process is described herein. As shown in FIG. 1, the fine wires 16 are inserted and set in the through-holes 12, 13 and 14 of the thus pasted inner and outer layer printed wiring boards 1, 4 and 6 (hereinafter, refer to as a multilayer printed wiring board). Each fine wire 16 is formed by a conductive member such as copper, and a plurality of fine wires having a diameter smaller than that of the through hole are inserted thereon. For example, if the diameter of the through hole 12 is 0.8 mm, the diameter of the fine wire 16 is made 50~100 mm and about 10~30 fine wires 16 are inserted in the through-hole 12. In this case, it is preferable that the surface of the fine wire 16 may be subjected to a flux treatment. The fine wire 16 is available under the tradename "winking wire CP-1515" and is manufactured by Taiyo Electric Industries Ltd. Small gaps are formed among the fine wires 16 inserted in the through hole 12 and this gap causes a capillary phenomenon between the fine wires 16. In the shown embodiment, the fine wire 16 has the same length as a sum of thickness of respective printed wiring boards 1, 4 and 6, but the length of the fine wire 16 is not limited, so long as the fine wire 16 causes the capillary phenomenon.

After inserting the fine wires 16, the multilayer printed wiring board is immersed in a solder vessel (not shown). The solder vessel is filled with molten solder held at about 260° C., and then the molten solder enters into the through-holes 12, 13 and 14 by the immersion of the multilayer printed wiring boards into the solder vessel. The molten solder is smoothly filled in the through holes 12, 13 and 14 by the capillary phenomenon between fine wires, so that the inner portion of the through-holes 12, 13 and 14 are filled by the fine wires 16 and the molten solder and as shown in FIG. 1, the molten solder contacts both connecting lands 10, 11. It is preferable to immerse the multilayer printed wiring board into the solder vessel for about 5 minutes in order to prevent thermal damage to the respective printed wiring boards 1, 4 and 6. Even in such a short immersion, the molten solder can be smoothly filled by the capillary phenomenon between the fine wires 16, so that the molten solder can be filled in the through holes 12, 13 and 14.

After immersion in the solder vessel, the fine wire 16 and the solder 17 completely fill in the through-holes 12, 13 and 14 and the solder 17 is in contact with the connecting lands 8, 9 and the connecting lands 10, 11, so that respective connecting lands 8, 9, 10 and 11 are electrically connected with each other.

In accordance with the present invention, the connecting lands 8, 9, 10 and 11 can be connected simply by the insertion of fine wires 16 into the through-holes 12, 13 and 14, and the immersion of the multilayer printed wiring board into the solder vessel. Thus, the connection between the connecting lands can be accomplished without performing troublesome treatments such as plating, printing and soldering, thereby fast and efficient mass production can be obtained. Since the solder is filled in the through-hole by the capillary phenomenon, a sufficient amount of solder is certain to be filled in the through-hole, so as to improve the connection reliability between the connecting lands.

FIGS. 2 through 6 show modifications of the fine wires 16 inserted in the through-holes 12, 13 and 14 of the multilayer printed wiring board, respectively. In the modified embodiment shown in FIG. 2, a plurality of fine wires 16 are inserted in a conductive short tube 18, and these fine wires 16 and the short tube 18 form a tubular body 19. If the tubular body 19 is inserted in the through-hole, the short tube 18 is also inserted in the through-holes 12, 13 and 14 and thus the fine wires 16 are inserted in the through hole together with the short tube 18. When the multilayer printed wiring board is immersed in the solder vessel with the tubular body 19 inserted, the solder is drawn into the through-hole by the capillary phenomenon between fine wires 16, so that a sufficient amount of solder can be filled in the through-hole.

Figure 2:
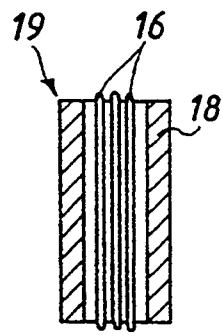
FIG. 2 is a sectional view showing a modification of fine wires shown in FIG. 1.
Figure 3:
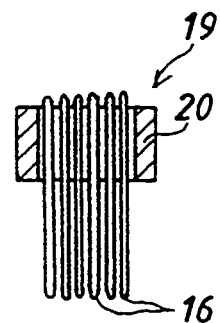
FIG. 3 is a sectional view showing another modification of fine wires shown in FIG. 1.

In the embodiment shown in FIG. 3, the short tube 20 having the length shorter than the short tube 18 of the tubular body 19 shown in FIG. 2 is used. The length of the short tube 20 is not limited, so long as the fine wires 16 are surely and easily inserted in the through-holes 12, 13 and 14. Therefore, even in the short tube 20 shown in FIG. 3, the fine wires 16 are easily inserted in the through-hole by inserting it in the through-hole from short tube side.

Figure 4:
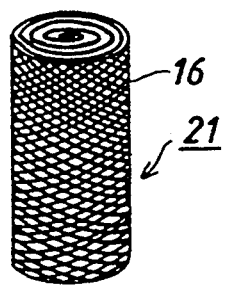
FIG. 4 is a sectional view showing an other modification of fine wires shown in FIG. 1.

FIG. 4 shows an inserting body 21 formed by spirally winding a mesh sheet formed by arranging the fine wires 16 in a meshed form, so that a capillary tube is formed between the meshed fine wires 16 and between the spiral mesh sheets. The thus formed inserting body 21 is inserted in the through-holes 12, 13 and 14, so that the solder is filled in the through-hole by the capillary phenomenon of the fine wires 16, and thus a sufficient amount of solder can be filled in the through-holes.

Figure 5:
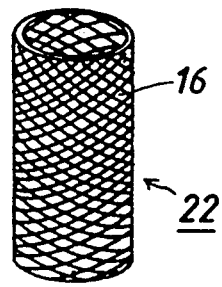
FIG. 5 is a sectional view showing a further modification of fine wires shown in FIG. 1.

FIG. 5 shows a tubular body 22 formed by winding a mesh sheet into a tubular shape. This tubular body 22 may be inserted in the through-holes 12, 13 and 14 as it is, or may be inserted in the through-hole having additional conductive fine wires 16 (not shown) inserted in the interior of the tubular body 22, so that in any case, the solder can be filed in the through-hole by the capillary phenomenon of the fine wires 16.

Figure 6:
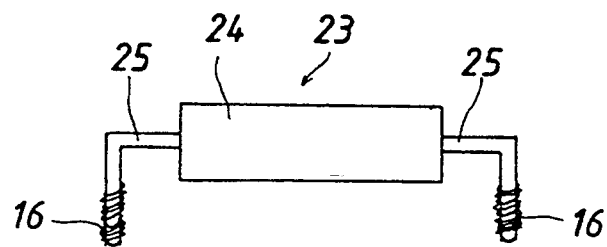
FIG. 6 is a side view of an electronic component showing an embodiment in case of using the fine wires and lead wire of electronic component in combination.

FIG. 6 shows a state where the fine wire 16 is wound on the lead wires of an electronic component 23. This electronic component 23 is mounted on the multilayer printed wiring board 15, and comprises a package body 24 accommodating IC, LSI or other chips therein and a plurality of lead wires 25 drawn out from the package body 24. The electronic component 23 is mounted by inserting the respective lead wires 25 in the through-holes 12, 13 and 14 of the multilayer printed wiring board 15. The fine wire 16 is wound on the tip portion of the lead wires 25 of the electronic component 23, and inserted in the through holes 12, 13 and 14 together with the lead wires 25, so that the filling of solder into the through-hole is performed, and fixing of leads 25 for the mounting of the electronic component 23 and the connecting of the connection lands 8, 9, 10 and 11 can all be performed, simultaneously.

If the connecting lands 8, 9, 10 and 11 are to be connected with, the lead 25 of the mounting component 23, the lead wires 15 themselves of the component 23 are formed of a plurality of fine wires 16 (not shown) instead of the fine wire 16 being wound on the lead wire 25 shown in FIG. 6.

The fine wire 16 may be previously subjected to solder plating for use in the respective embodiments.

As described above, the multilayer (four layer) printed wiring board shown in FIG. 1 can be easily manufactured in accordance with the present invention. Moreover, in the above explanation, after respective forming processes of respective printed wiring boards 1, 4 and 6, the registration and pasting processes of respective printed wiring boards 1, 4 and 6 with each other are performed, and then the connecting process of the connection lands 8, 9, 10 and 11 is performed. However, prior to this connecting process, the portions other than the connection lands 10, 11 of the printed wiring circuits 5, 7 required for the connecting process of the first and the second outer layer printed wiring boards 4 and 6 are covered with solder resists 26, 27 and a necessary marking printing process or the like is performed.

Then, the shaping of the multilayer printed wiring board is completed by performing further necessary cutting, trimming and routing as well as surface treatment after flux applying, and other necessary working and treatments.

It is further understood by those skilled in the art that the forgoing description is a preferred embodiment of the disclosed device and that various changes and modifications may be made in the invention without departing from the spirit and scope thereof.

For example, the construction and shaping process of the inner and outer layer printed wiring boards 1, 4 and 6 in the above manufacturing method are not limited thereto, but can be performed by the construction and the shaping process according to the designs of pattern required to respective layers.

Moreover, the construction and the manufacturing method of the multilayer printed wiring board 15 of 4 layers itself are not limited to the previous embodiments, but can be adopted to the manufacture of multilayer printed wiring board of other than 4 layers with the same function and disadvantageous effect thereof. In the previous embodiment, further, as to the perforation of the respective through holes 12, 13 and 14 with reference to the respective shaping process of the respective inner and outer layer printed wiring boards 1, 4 and 6, the perforation by drilling or the like can be carried out all at one after the lamination process for bonding of respective printed wiring boards 1, 4 and 6 instead of respective perforation processes for each wiring board.

For example, the inner layer printed wiring board 1 is subjected to a perforation process for forming the through-hole 12 after forming printed wiring circuits 2, 3 and after the bonding process of the other printed wiring boards 4, 6, and the first and the second outer layer printed wiring boards 4, 6 can be perforated either before or after the bonding process, and the same can be adopted for the formation of the printed wiring board.

Similarly, other multilayer printed wiring boards can be manufactured using design changes of the various manufacturing processes.

As is seen from the previous embodiments, the electric connection of the printed wiring circuits 2, 3, 5 and 7 with each of respective layers can be performed by a soldering process instead of the plating process, so that the cost of equipment can be decreased and the working environment and the management are improved, as well as resolving the problems of environmental sanitation. At the same time, the outer diameter of the connection lands 8, 9 for soldering connection is made larger than the diameter of through-holes 13, 14 of the connection lands 10, 11 and the diameter of the through-holes 13, 14 of the connection lands 10, 11 is made larger than that of the through-hole 12 of the connection lands 8, 9, so that the surface area of the connection lands 8, 9 exposed at the opening portion of the through-holes 13, 14 is increased, and thus the reliability of the soldered connection is improved. In the conventional method, the contact area is limited by the thickness of the copper foil of respective circuits when the connection is due to the through-hole plating.

The manufacturing method for multilayer printed wiring boards in accordance with the present invention, provides simple manufacture, low cost, improved reliability and high quality.

What is claimed is:

1. A method of manufacturing a multilayer printed wiring board, in which respective layers of a multilayer printed wiring board are formed with respective printed wiring boards, respective printed wiring boards are laminated and pasted up, and circuits of the printed wiring board are electrically connected through through-holes formed in the respective printed wiring boards, the method comprising steps of:
    inserting a plurality of fine wires into respective through-holes formed in the respective printed wiring boards;
    filling solder in the through-holes by a capillary phenomenon; and
    electrically connecting circuits to the filled through-holes to electrically connect the circuits between the respective printed wiring boards with each other.

2. A method of manufacturing a multilayer printed wiring board as claimed in claim 1; wherein the plurality of fine wires inserted into the respective through-holes formed in the respective printed wiring boards are formed by a tubular body which comprises a conductive short tube and a plurality of fine wires.

3. A method of manufacturing a multilayer printed wiring board as claimed in claim 1; wherein the plurality of fine wires inserted into the respective through-holes formed in the respective printed wiring boards are formed by an inserting body which comprises a mesh sheet formed by arranging the fine wires in a meshed form.

4. A method of manufacturing a multilayer printed wiring board as claimed in claim 1; wherein the plurality of fine wires are wound on lead wires of an electronic component.

5. A method of manufacturing a multilayer printed wiring board as claimed in claim 3; wherein the plurality of fine wires inserted into the respective through-holes formed in the respective printed wiring boards are formed into a tubular body formed by forming the mesh sheet into a tubular shape.

6. A method of manufacturing a multilayer printed wiring board as claimed in claim 2; wherein the plurality of fine wires inserted into the respective through-holes formed in the respective printed wiring boards are formed by a tubular body which comprises a conductive short tube having a length shorter than a length of the plurality of fine wires.

7. A method of manufacturing a printed wiring board, comprising the steps of: providing a printed wiring board having a substrate and a circuit pattern formed thereon; forming at least one through-hole in the substrate; providing a plurality of fine wires; inserting the plurality of fine wires into the at least one through-hole; and filling the at least one through-hole with a molten solder by capillary action due to small gaps formed between the fine wires inserted in the at least one through-hole.

8. A method of manufacturing a printed wiring board according to claim 7; wherein the step of providing a printed wiring board comprises providing a multilayer printed wiring board comprising a plurality of wiring board layers each having a substrate and a respective circuit pattern formed thereon; and the step of filling the at least one through-hole includes filling the at least one through-hole with the molten solder to electrically connect at least two of the respective circuit patterns.

9. A method of manufacturing a printed wiring board according to claim 7; further comprising the step of electrically connecting an electrical component to the at least one through-hole.

10. A method of manufacturing a printed wiring board according to claim 7; wherein the step of providing the plurality of fine wires includes providing a conductive hollow tubular body having the plurality of fine wires disposed therein; and the step of inserting the plurality of fine wires includes inserting the conductive hollow tubular body having the plurality of fine wires disposed therein into the at least one through-hole.

11. A method of manufacturing a printed wiring board according to claim 10; wherein the conductive hollow tubular body has a shorter length than the length of the plurality of fine wires.

12. A method of manufacturing a printed wiring board according to claim 7; wherein the step of providing the plurality of fine wires includes providing the plurality of fine wires arranged as a mesh sheet spirally wound into a filled tubular form.

13. A method of manufacturing a printed wiring board according to claim 7; wherein the step of providing the plurality of fine wires includes providing the plurality of fine wires arranged as a mesh sheet wound into a hollow tubular form.

14. A method of manufacturing a printed wiring board according to claim 13; wherein the step of providing the plurality of fine wires further includes providing additional wires disposed within the hollow tubular form.

15. A method of manufacturing a printed wiring board according to claim 7; wherein the step of providing the plurality of fine wires includes providing the plurality of fine wires arranged as leads for an electronic component.

16. A method of manufacturing a printed wiring board according to claim 7; wherein the step of providing the plurality of fine wires includes providing the plurality of fine wires wound around leads of an electronic component.

* * * * *